United States Patent [19]

Shimizu

[11] Patent Number: 5,158,223
[45] Date of Patent: Oct. 27, 1992

[54] WIRE BONDING APPARATUS

[75] Inventor: Yasuhiko Shimizu, Yokohama, Japan

[73] Assignee: Kabushiki Kaisha Toshiba, Kawasaki, Japan

[21] Appl. No.: 708,994

[22] Filed: May 31, 1991

[30] Foreign Application Priority Data

Jun. 8, 1990 [JP] Japan .................................. 2-151324

[51] Int. Cl.⁵ ............................................ B23K 20/10
[52] U.S. Cl. .................................... 228/1.1; 228/110; 228/904
[58] Field of Search .................. 228/1.1, 4.5, 904, 110

[56] References Cited

U.S. PATENT DOCUMENTS

| | | | |
|---|---|---|---|
| 4,327,860 | 5/1982 | Kirshenboin et al. | 228/4.5 |
| 4,445,633 | 5/1984 | Bonham, Jr. | 228/4.5 |
| 4,571,688 | 2/1986 | Kashihara et al. | 228/102 |
| 4,597,522 | 7/1986 | Kobayashi | 228/4.5 |
| 4,759,073 | 7/1989 | Shah et al. | 228/4.5 |
| 4,855,928 | 8/1989 | Yamanaka | 228/4.5 |
| 4,903,883 | 2/1990 | Thurlemann et al. | 228/1.1 |
| 5,044,543 | 9/1991 | Yamazaki et al. | 228/1.1 |

FOREIGN PATENT DOCUMENTS 60-235432  11/1985  Japan .................................. 228/4.5

*Primary Examiner*—Richard K. Seidel
*Assistant Examiner*—Jeanne M. Elpel
*Attorney, Agent, or Firm*—Foley & Lardner

[57] ABSTRACT

A wire bonding apparatus for connecting a chip electrode of a semiconductor chip and an inner lead of a lead frame through a bonding wire is described. The apparatus is provided with an X-Y table having a bonding head. An ultrasonic horn is attached rotatably to the bonding head, and extends in the Y direction. The ultrasonic horn has a capillary which holds the bonding wire. A Y table moving calculator which calculate a Y direction moving amount of the X-Y table, while taking a Z direction moving amount of the capillary into account, is provided. A signal from the Y table moving calculator is inputted to a Y table controller which controls Y direction movement of the X-Y table.

2 Claims, 5 Drawing Sheets

WIRE BONDING APPARATUS

BACKGROUND OF THE INVENTION

The present invention relates to a wire bonding apparatus for connecting a chip electrode of a semiconductor chip and an inner lead of a lead frame through a bonding wire.

A conventional wire bonding apparatus comprises an X-Y table having a bonding head, and an ultrasonic horn attached rotatably to the X-Y table. The ultrasonic horn extends in the Y direction, and a capillary which holds the bonding wire is secured to the end of the ultrasonic horn.

Operation of the conventional apparatus is as follows.

First, wire bonding between the chip electrode of the semiconductor chip and the bonding wire is performed. Then the capillary is raised slightly, and then the capillary is horizontally moved (reversed) to the semiconductor chip by a predetermined reverse amount. After that, the capillary is raised further until the total height is Z stroke, and then the capillary is lowered while being horizontally moved toward the inner lead.

When the capillary is raised, the capillary is not raised precisely in a vertical direction, because the capillary is operated by rotation of the ultrasonic horn. Raising the capillary therefore causes an error $\Delta y$ in the Y direction.

However, when the error $\Delta y$ becomes large with the enlargement of the loop length of the bonding wire, the error $\Delta y$ causes problems that an inadequate loop bend or loop slack occurs on either the Y plus loop or the Y minus loop.

SUMMARY OF THE INVENTION

It is an object of the present invention to provide a wire bonding apparatus for connecting a chip electrode of a semiconductor chip and an inner lead of a lead frame through a bonding wire, and in particular, for making substantially the same loops of bonding wire on both the Y plus side and the Y minus side.

The foregoing object is accomplished by providing a wire bonding apparatus for connecting a chip electrode of a semiconductor chip and an inner lead of a lead frame through a bonding wire comprising: an X-Y table having a bonding head and moving in the X direction and in the Y direction; an ultrasonic horn attached rotatably to the bonding head, extending in the Y direction, and having a capillary which holds the bonding wire; a Y table moving calculator for calculating a Y direction moving amount of the X-Y table, while taking a Z direction moving amount of the capillary into account; and a Y table controller for controlling the Y direction movement of the X-Y table on the basis of a signal from the Y table moving calculator.

According to the present invention, the Y table moving calculator calculates the Y direction moving amount of the X-Y table, taking the Z direction moving amount of the capillary into account, and the Y table controller controls the Y direction movement of the X-Y table on the basis of the signal from the Y table moving calculator, therefore substantially the same loops of bonding wire are made on both the Y plus side and the Y minus side.

DETAILED DESCRIPTION OF THE PREFERRED EMBODIMENTS

For a better understanding of the background of the present invention, the basic principle of the conventional wire bonding apparatus is first described hereinafter with reference to FIG. 3.

Figure 3:
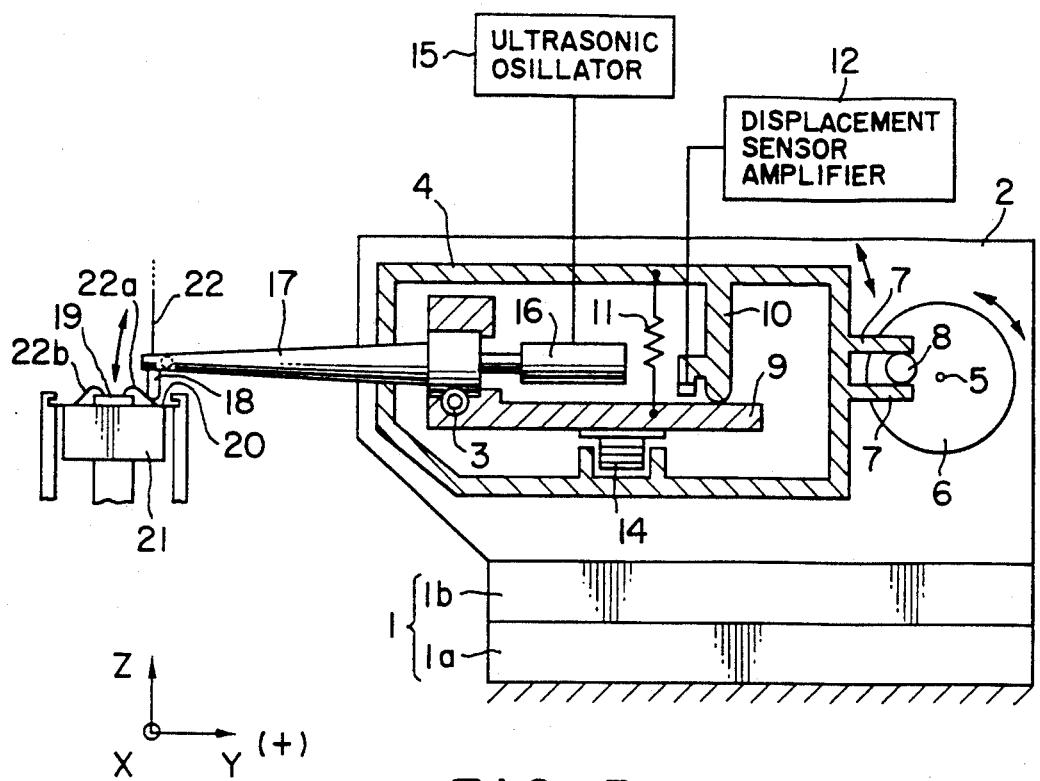
FIG. 3 is a schematic view showing a conventional wire bonding apparatus.

As shown in FIG. 3, the conventional wire bonding apparatus comprises an X-Y table 1 which consists of an X table 1a movable in the X direction and a Y table 1b movable in the Y direction, and a bonding head 2 mounted on the X-Y table 1. A body 4 is rotatably supported by a shaft 3, and a disk 6 rotatable about a shaft 5 by a Z motor (not shown) are provided within the body 4. A pin 8 protruding from the disk 6 is engaged with a pair of arms 7, 7 protruding from the back end of the body 4, so that the body 4 is rotated about the shaft 3 by rotating the disk 6.

A support member 9 rotatably supported by the shaft 3 is provided within the body 4. The support member 9 is pressed against a stopper 10 of the body 4 by a spring 11 and by a linear motor 14 fixed to the support member 9. A displacement sensor 13 is secured to the stopper 10, and a displacement sensor amplifier 12 is connected to the displacement sensor 13.

An ultrasonic horn 17 having a vibrator 16 is secured to the support member 9 at the proximal end thereof. An ultrasonic oscillator 15 is connected to the vibrator 16. The ultrasonic horn 17 protrudes from the body 4, and a capillary 18 is held by the distal end of the ultrasonic horn 17.

A sample stand 21 is provided under the capillary 18 on which a semiconductor chip 19 and a lead frame 20 are mounted in place, and a bonding wire 22 is inserted within the capillary 18.

Figure 4:
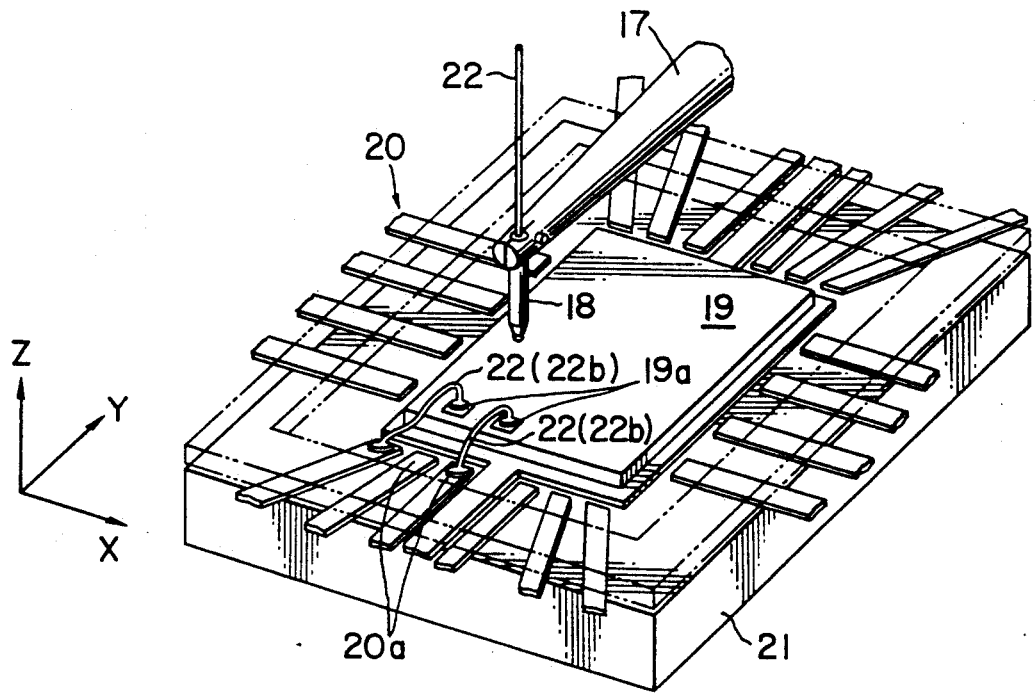
FIG. 4 is a perspective view showing a wire bonding operation of the wire bonding apparatus.

First, the bonding head 2 is moved in a horizontal direction (X-Y direction) to one predetermined position by the X-Y table 1, and then the capillary 18 is lowered in a vertical direction (Z direction) through the ultrasonic horn 17 by rotating the disk 6. The lower end of the bonding wire 22 is impacted against a chip electrode 19a of the semiconductor chip 19, and at the same time an ultrasonic oscillation generated at the vibrator 16 is transmitted to the bonding wire 22, so that the wire bonding between the bonding wire 22 and the chip electrode 19a is completed. After that, the capillary 18 is raised in the Z direction to a predetermined level, and then the capillary 18 is lowered in the Z direction while the bonding head 2 is moved in the horizontal direction to another predetermined position. Next the wire bonding between the bonding wire 22 and an inner lead 20a of the lead frame 20 is completed in the same way as that between the bonding wire 22 and the chip electrode 19a. Thus, each chip electrode 19a of the semiconductor chip 19 is connected to the inner lead 20a of the lead frame 20 corresponding to the chip electrode 19a through the bonding wire 22 by using the capillary 18 as shown enlarged in FIG. 4.

In FIG. 3, when a direction towards the bonding head 2 and parallel to the ultrasonic horn 17 is Y plus direction, the bonding wire 22 connecting the chip electrode 19a of the semiconductor chip 19 and the inner lead 20a of the lead frame 20 forms a Y plus loop 22a or a Y minus loop 22b.

Figure 5:
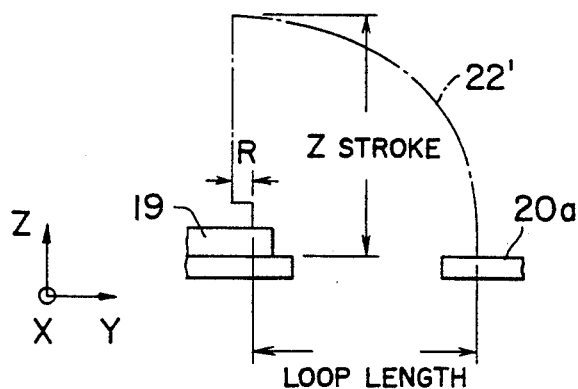
FIG. 5 is a view showing a locus of a capillary of the wire bonding apparatus.

In the case where the (second) wire bonding between the bonding wire 22 and the inner lead 20a which is a predetermined loop length far from the chip electrode 19a is performed after the (first) wire bonding between the bonding wire 22 and the chip electrode 19a, the capillary 18 is first raised slightly from its starting point on the chip 19, and then the capillary 18 is horizontally moved (reversed) towards the inside of the semiconductor chip 19 by a predetermined reverse amount. After that the capillary 18 is raised further until the total height is Z stroke, and then the capillary 18 is lowered while being horizontally moved toward the inner lead 22a as shown in FIG. 5.

When the capillary 18 is raised, the capillary 18 is not raised in a precisely vertical direction because the capillary 18 is operated by the ultrasonic horn 17 rotating about the shaft 3. Thus, raising the capillary 18 causes a error $\Delta Y$ in Y direction.

The error $\Delta Y$ may be represented as follows, where Z stroke is Zst, the length between the end of the capillary 18 and the center of the shaft 3 is A, and an angle between the line connecting the end of the capillary 18 and the center of the shaft 3 at a first position and the line at a second position where the capillary 18 is moved at Zst is $\theta$.

$$\theta = \sin^{-1}\left(\frac{Zst}{A}\right) \quad (1)$$

$$\Delta y = A(1 - \cos\theta) \quad (2)$$

from equations (1) and (2)

$$\Delta y = A\left\{1 - \cos\left(\sin^{-1}\frac{Zst}{A}\right)\right\} \quad (3)$$

The error $\Delta Y$ always occurs on the plus side of the Y axis by raising the capillary 18 in Z direction. Therefore, the effect of the error $\Delta Y$ of the Y plus loop 22a differs from that of the Y minus loop 22b.

Figure 7:
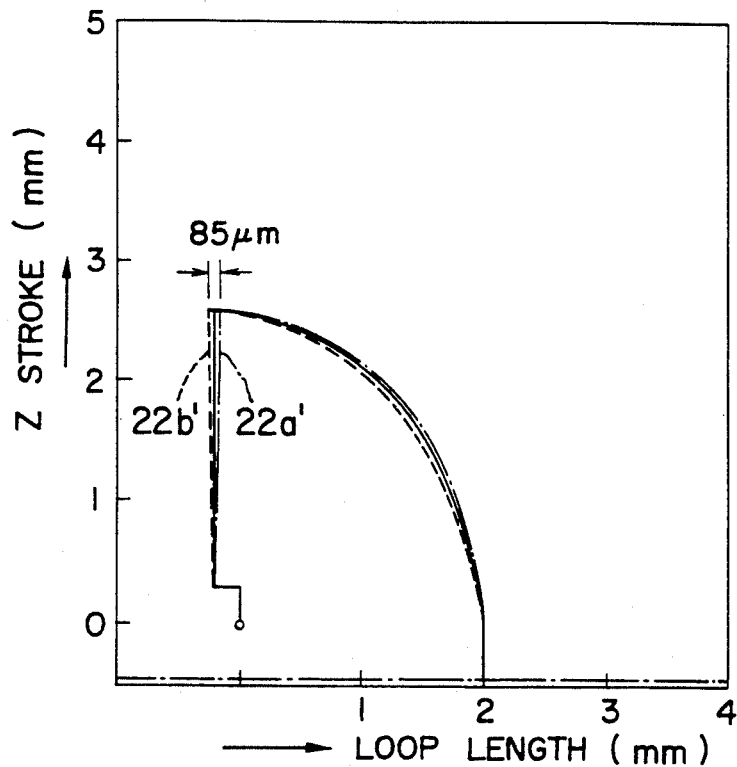
FIG. 7 is a view showing the error $\Delta y$ in the case where the loop length of the bonding wire is 2.0 mm.

The effect of the error $\Delta Y$ is shown by the locus of the end of the capillary 18 in FIG. 7. In FIG. 7, the left direction of the Y plus loop 22a is the Y plus direction and the right direction of the Y minus loop 22b is the Y plus direction, because the Y plus loop 22a and the Y minus loop 22b which are actually symmetric (as shown in FIG. 3) are shown in the same direction.

An error $2\Delta y$ occurs between a top end of a locus 22a' of the capillary 18 making the Y plus loop 22a and a top end of a locus 22b' of the capillary 18 making the Y minus loop 22b. This total error $2\Delta y$ is made p of the bonding error $\Delta y$ between the chip 19 and the bonding grace 22a' of the capillary 18 and the bonding error $\Delta y$ between the chip 19 and the bonding trace 22b' of the capillary 18. As shown in FIG. 7, the error $2\Delta y$ is very small, for example 85 μm ($2\Delta y = 85$ μm), when the loop length is 2 mm and Z stroke is 2.5 mm. Thus, the error $2\Delta y$ has not caused problems. Therefore, even if the error occurs by raising the capillary in the Z direction, the amendment with respect to the error has not been performed.

Recently, semiconductor chips have been becoming large with the sophisticated functions of an integrated circuit, and the loop length is becoming long with improved integrated circuits. Thus, the Z stroke is required to be longer in order to obtain a long loop length.

Figure 8:
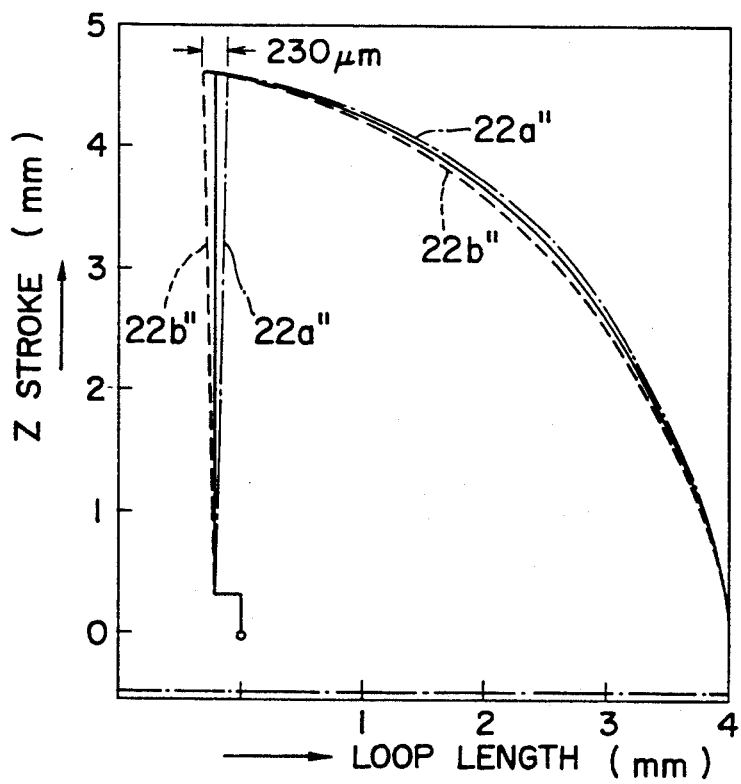
FIG. 8 is a view showing the error $\Delta y$ in the case where the loop length of the bonding wire is 4.0 mm.

For example, when the loop length is 4 mm, and Z stroke is 4.5 mm as shown in FIG. 8, the error $2\Delta y$ between the top end of the locus 22a'' and the top end of the locus 22b'' is becoming large, or 230 μm ($2\Delta y = 230$ μm). The error $2\Delta y$ may be considered as the difference between the reverse amount of Y plus loop 22a and that of Y minus loop 22b. The reverse amount affects the height, the bend, and the slack of the bonding wire 22, and therefore an adequate reverse amount is required according to the loop length.

However, in the case that the difference between the reverse amounts becomes large with the enlargement of the loop length and the Z stroke, for example when the reverse amount of Y plus loop 22a is adequate, the reverse amount of the Y minus loop 22b is short or excessive and accordingly, problems of inadequate bend or slack of loop occur.

First Embodiment

A first embodiment of the wire bonding apparatus of the present invention will become understood from the following detailed description referring to the accompanying drawings.

Figure 1:
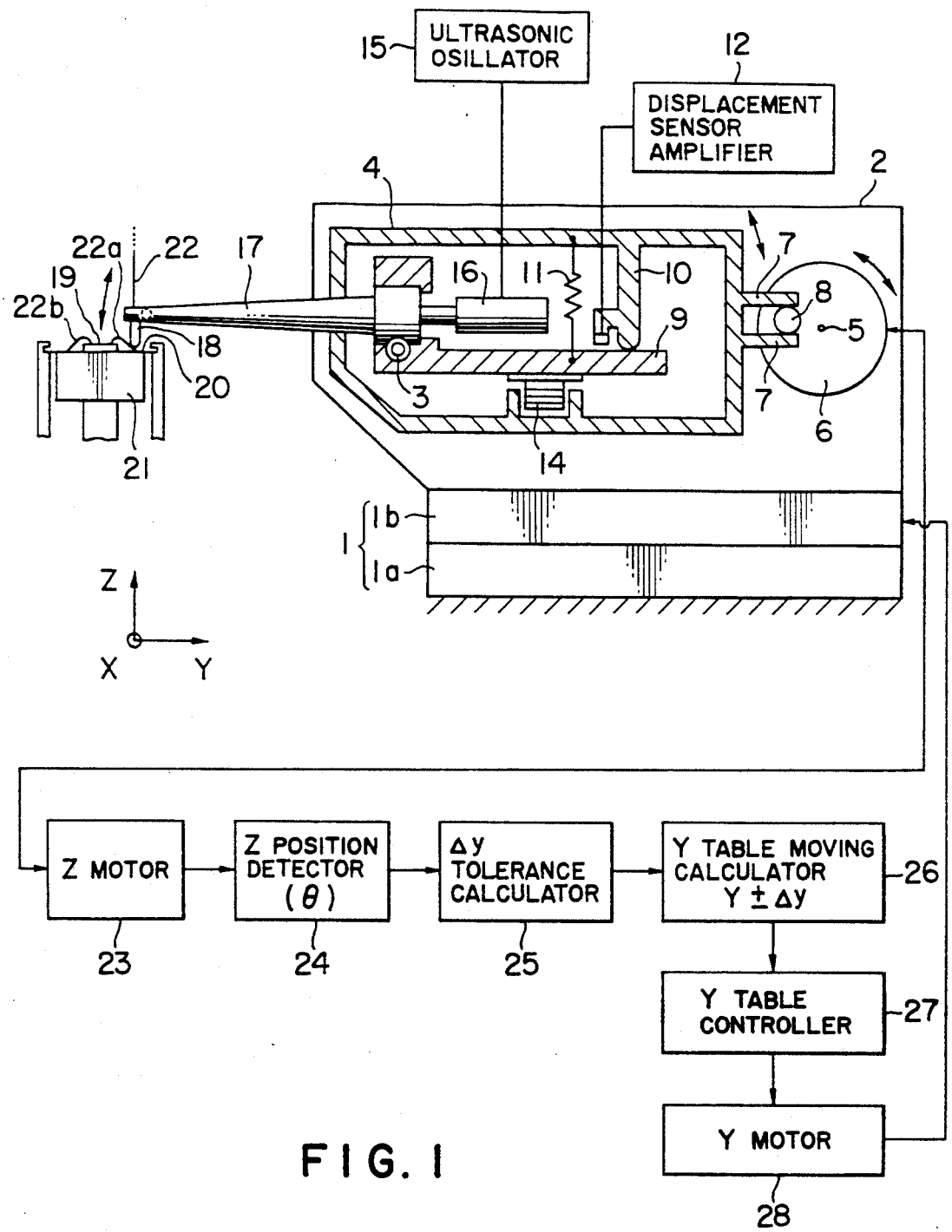
FIG. 1 is a schematic view showing a first embodiment of a wire bonding apparatus according to the present invention.

FIG. 1 shows a first embodiment of the wire bonding apparatus, in which the same reference numerals are given to the portions corresponding to those in FIG. 3.

Figure 6:
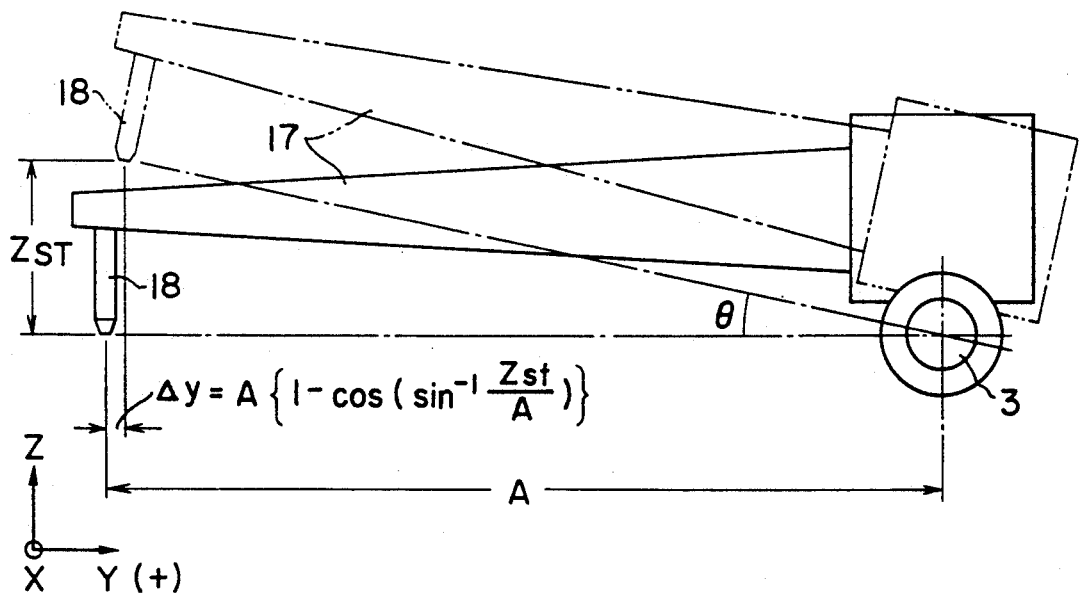
FIG. 6 is a view showing a error $\Delta y$ of the capillary for calculating the error.

A Z motor 23 rotating the disk 6 is provided with a Z position detector 24 which detects the Z direction position (Z stroke Zst) of the capillary 18 during the looping operation of the capillary 18. The Z position detector 24 has an encoder for outputting output pulses on the basis of the rotation of the Z motor 23, and a pulse counter for counting the output pulses from the encoder. That is, the Z position detector 24 detects the angle $\theta$ (shown in FIG. 6) and Z stroke Zst by the rotating angle of the Z motor 23.

The Z position detector 24 is connected to a $\Delta y$ error calculator 25, so that a signal from the Z position detector 24 is inputted to the $\Delta y$ error calculator 25, where the error $\Delta y$ corresponding to the Z direction position (Z stroke Zst) is calculated on the basis of the equation (3) mentioned above.

The $\Delta y$ error calculator 25 is connected to a Y table moving calculator 26. The error $\Delta y$ calculated by the $\Delta y$ error calculator 25 is inputted to the Y table moving calculator 26, where a moving amount $Y \pm \Delta y$ of the Y table is calculated taking the error $\Delta y$ into account. In this case, the moving amount of the Y table is $Y - \Delta y$ when the Y plus loop 22a is made, and the moving amount of the Y table is $Y + \Delta y$ when the Y minus loop 22a is made.

The Y table moving calculator 26 is connected to a Y table controller 27. An output signal from the Y table controller 27 is inputted to a Y motor 28, so that the Y table 1b is moved according to the moving amount calculated by the Y table moving controller 26.

In this way, the error $\Delta y$ of Y direction caused by raising the capillary 18 in the Z direction is calculated according to the Z direction position of the capillary 18, and the moving amount of the Y table is determined by taking the error $\Delta y$ into account. Therefore, the difference between the reverse amounts of the Y plus loop 22a and the Y minus loop 22b is eliminated so that both the reverse amounts are same.

Second Embodiment

Figure 2:
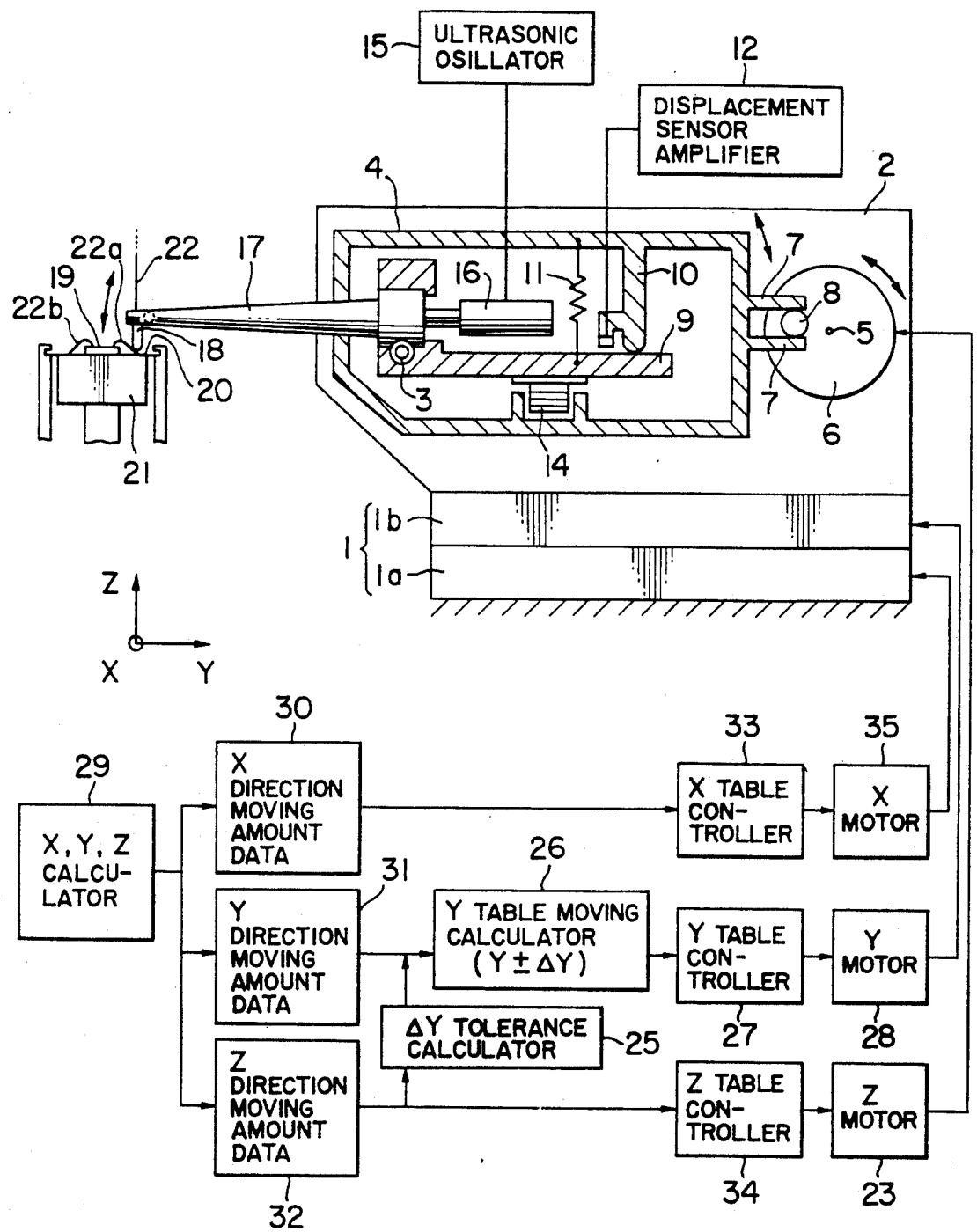
FIG. 2 is a schematic view showing a second embodiment of the wire bonding apparatus according to the present invention.

FIG. 2 shows a second embodiment of the wire bonding apparatus of the present invention. In FIG. 2, an XYZ calculator 29 which calculates moving amount data of the wire bonding apparatus and outputs the moving amount data, is provided. The moving amount data from the XYZ calculator 29, for example X direction moving amount data 30 and the Z direction moving amount data 32 are inputted to a X table controller 33 and a Z controller 34 respectively. At the same time, the Y direction moving amount data 31 are inputted to the Y table moving calculator 26, and the Z direction moving amount data 32 are inputted to the Y table moving calculator 26 via the $\Delta y$ error calculator 25. In the Y table moving calculator 26, the Y direction moving amount data 31 are amended taking the Z direction moving amount data 32 into account. The Y direction moving amount data 31 amended by the Y table moving calculator 26 are outputted to the Y table controller 27. That is, the Z direction moving amount data 32 calculated by the XYZ calculator 29 are inputted to the Z controller 34, the Z motor 23 is operated on the basis of an output signal of the Z controller 34. Therefore, the Z direction moving amount (Z stroke) of the capillary 18 and the error $\Delta y$ of the capillary 18 are determined according to the Z direction moving amount data 32. The Y direction moving amount or $Y \pm \Delta y$ of the Y table is determined by the Y table moving calculator 26, and then an output signal from the Y table moving calculator 26 is inputted to the Y table controller 27. A Y motor 28 is operated by an output signal from the Y table controller 27. The Y table 1b is moved by the Y motor 28 taking the error $\Delta y$ into account. An output signal from the X table controller 33 is inputted to a X motor 35 driving the X table 1. The X table 1 is moved according to the output signal from the X table controller 33.

In the second embodiment, the Y table may be moved while being precisely responsive to the movement of the capillary, because the Y direction moving amount data 31 is directly amended by using the Z direction moving amount data 32.

What is claimed is:

1. A wire bonding apparatus for connecting a chip electrode of a semiconductor chip and an inner lead of a lead frame through a bonding wire comprising:

an X-Y table having a bonding head and moving in a X direction and in a Y direction;

an ultrasonic horn attached rotatably to the bonding head, extending in the Y direction, and having a capillary which holds the bonding wire;

a Z position detector detecting a Z position of the capillary;

a $\Delta y$ error calculator for calculating an error, $\Delta y$, of the capillary according to the Z position of the capillary detected by the Z position detector;

a Y table moving calculator for calculating a Y direction moving amount of the X-Y table on the basis of the error $\Delta y$ from the $\Delta y$ error calculator so as to eliminate the error $\Delta y$; and a Y table controller for controlling the Y direction movement of the X-Y table on the basis of the signal from the Y table moving calculator.

2. A wire bonding apparatus for connecting a chip electrode of a semiconductor chip and an inner lead of a lead frame through a bonding wire comprising:

an X-Y table having a bonding head and moving in a X direction and in a Y direction;

an ultrasonic horn attached rotatably to the bonding head, extending in the Y direction, and having a capillary which holds the bonding wire;

an XYZ, calculator for outputting X direction moving amount data, Y direction moving amount data, and Z direction moving amount data, a $\Delta y$ error calculator for calculating an error $\Delta y$ of th capillary according to the /Z direction moving amount data from the XYZ calculator;

a Y table moving calculator for calculating a Y direction moving amount of the X-Y table on the basis of the Y direction moving amount data from the XYZ calculator and the error $\Delta y$ from the $\Delta y$ error calculator so as to eliminate the error $\Delta y$; and a Y table controller for controlling the Y direction movement of the X-Y table on the basis of a signal from the Y table moving calculator.

* * * * *